United States Patent
Wu

(10) Patent No.: US 11,841,924 B2
(45) Date of Patent: Dec. 12, 2023

(54) DRAWING MATCHING TOOL

(71) Applicant: Procore Technologies, Inc., Carpinteria, CA (US)

(72) Inventor: Lei Wu, Dublin, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 448 days.

(21) Appl. No.: 17/237,742

(22) Filed: Apr. 22, 2021

(65) Prior Publication Data
US 2022/0343107 A1    Oct. 27, 2022

(51) Int. Cl.
| | |
|---|---|
| *G06F 18/22* | (2023.01) |
| *G06F 30/13* | (2020.01) |
| *G06F 30/12* | (2020.01) |
| *G06F 30/18* | (2020.01) |
| *G06V 30/422* | (2022.01) |

(52) U.S. Cl.
CPC .............. *G06F 18/22* (2023.01); *G06F 30/12* (2020.01); *G06F 30/13* (2020.01); *G06F 30/18* (2020.01); *G06V 30/422* (2022.01)

(58) Field of Classification Search
CPC .......... G06F 18/22; G06F 30/12; G06F 30/13; G06F 30/18; G06V 30/422
See application file for complete search history.

(56) References Cited

U.S. PATENT DOCUMENTS

| | | | |
|---|---|---|---|
| 2010/0092072 A1* | 4/2010 | Guntur ................... | G06T 19/00 |
| | | | 382/154 |
| 2019/0251237 A1* | 8/2019 | Park ....................... | H04N 23/90 |

FOREIGN PATENT DOCUMENTS

WO   WO-2022247126 A1 * 12/2022 .......... G06K 9/6215

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

* cited by examiner

*Primary Examiner* — Marcos L Torres
(74) *Attorney, Agent, or Firm* — Lee Sullivan Shea & Smith LLP

(57) ABSTRACT

The present disclosure is directed to a software tool that engages in an image matching technique. In one implementation, the software tool (i) accesses a set of two-dimensional drawings representative of a construction project, (ii) determines multiple candidate pixel regions for each of the two-dimensional drawings, (iii) compares the candidate pixel regions to identify a set of landmark pixel regions that appear in the set of two-dimensional drawings at a threshold rate, (iv) compare a first subset of landmark pixel regions from a first two-dimensional drawing with a second subset of landmark pixel regions from a second two-dimensional drawing to identify matching landmark pixel regions, (v) project the first and second two-dimensional drawings onto a projection space such that a maximum number of the matching landmark pixel regions align, and (vi) determine an extent of similarity between the projected first and second two-dimensional drawings in the projection space.

20 Claims, 10 Drawing Sheets
(6 of 10 Drawing Sheet(s) Filed in Color)

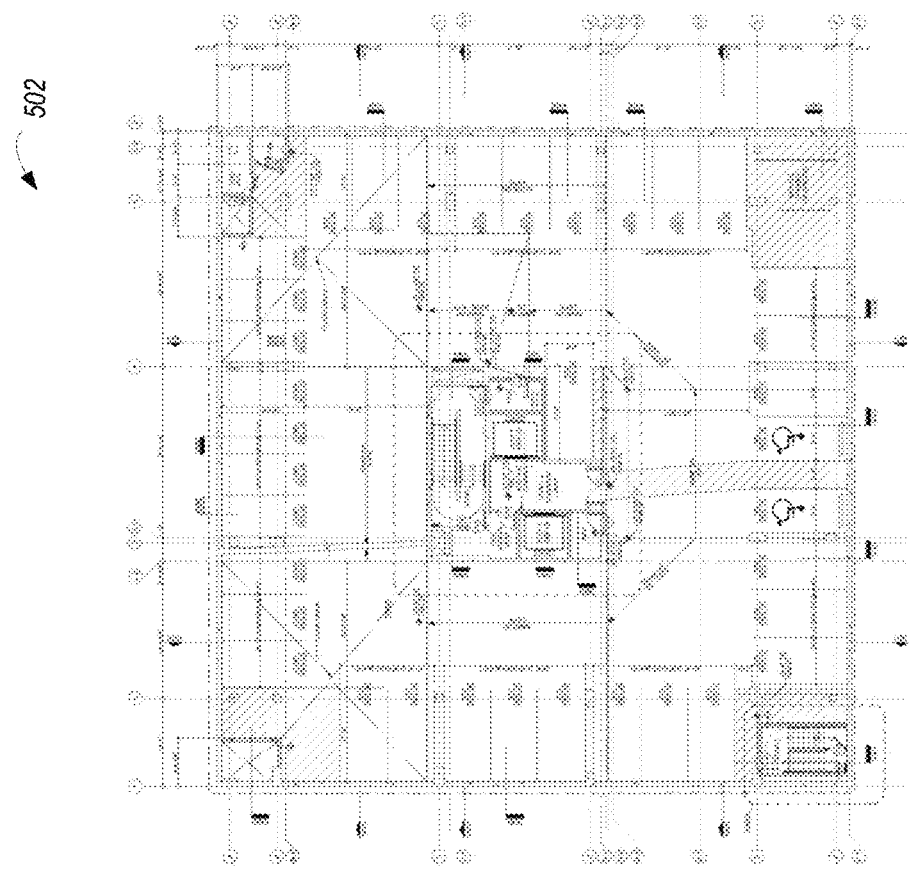
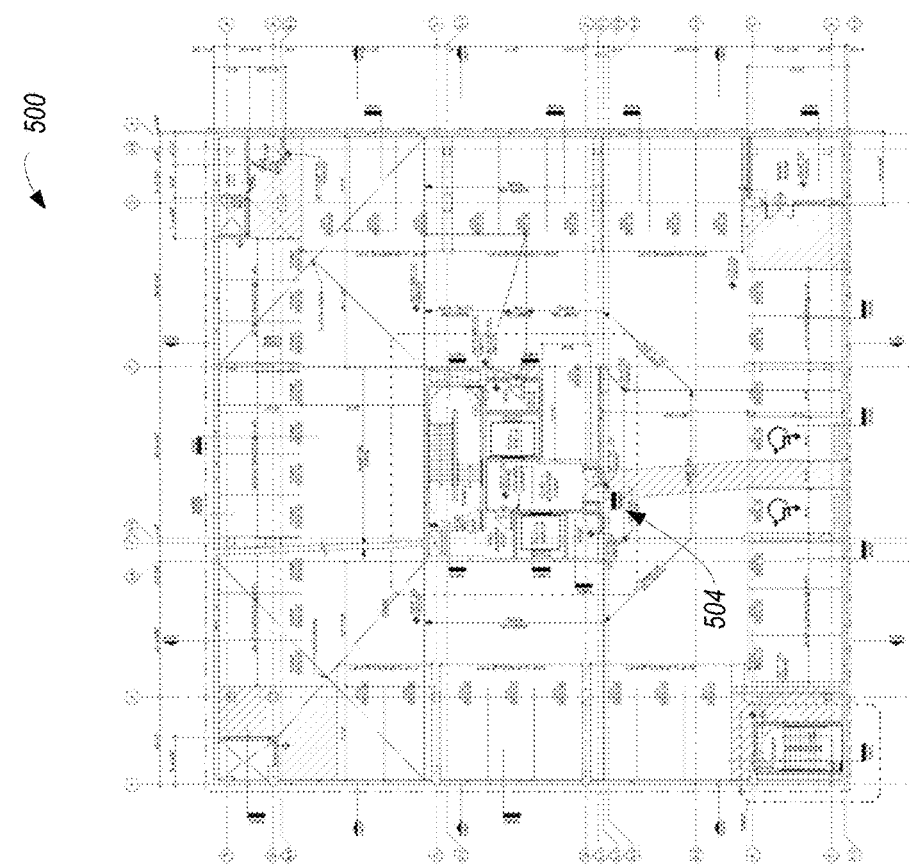

DRAWING MATCHING TOOL

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

OVERVIEW

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

Two-dimensional technical drawings have advantages. For instance, they are often set out in a universally-recognized format that most, if not all, construction professionals can read and understand. Further, they are designed to be relatively compact, with one drawing being arranged to fit on a single piece of paper or in a computerized file format that requires minimal processing power and computer storage (e.g., a PDF viewer, JPEG viewer, etc.). Yet, two-dimensional drawings have disadvantages as well. For instance, it often takes multiple drawings in order to visually communicate an overview of an entire construction project. This is due to the fact that two-dimensional drawings tend not to efficiently present information about the construction project from a third (e.g., vertical) dimension. Typically, a construction project may have at least one two-dimensional technical drawing per floor of the construction project. Thus, for a construction project spanning, say, ten floors, the construction project will have at least ten two-dimensional technical drawings, and perhaps more to fully visually communicate the various aspects of the construction project.

To advance over two-dimensional technical drawings, computerized, three-dimensional technology was developed as another form in which information about a construction project can be visually communicated. In this respect, a three-dimensional model of the construction project would be embodied in a computerized form, such as in a building information model (BIM) file, with three-dimensional meshes visually representing the physical elements of the construction project (e.g., walls, ducts, etc.). Specialized software is configured to access a BIM file and, based on this BIM file, render a three-dimensional view of the construction project from one or more perspectives. This provided some advantages over two-dimensional technical drawings, namely that a construction professional could often get a full overview of the entire construction project based on a single three-dimensional view and thus may not have to shuffle through multiple two-dimensional drawings in order to conceptualize what the construction project looks like. In addition, the specialized software allowed a construction professional to navigate throughout the three-dimensional view and focus on elements of interest in the construction project, such as a particular wall or duct.

Some BIM viewer technology provides the capability to generate a top-down two-dimensional drawing of a portion of a construction based on a particular three-dimensional view of that portion of the construction project. This top-down two-dimensional drawing may then be compared to a traditional two-dimensional technical drawing, such as a PDF construction plan or blueprint, in order to assess whether the construction plan or blueprint depicts or describes the same portion of the construction project being displayed by the 3D BIM viewer.

Additionally, when working with numerous two-dimensional drawings associated with a construction project, a construction professional may wish to compare the two-dimensional drawings to each other for various other reasons as well. For instance, it may be useful to identify differences between two drawings that depict the same portion of the construction project. As an example, the two drawings may include an original drawing and a revised drawing of the portion of the construction project, and the construction professional may wish to identify the revisions that were made to the original drawing by comparing the two drawings. Further, it may be useful to compare the two-dimensional drawings to determine which drawings depict the same portion of the construction project for purposes of organizing the drawings in a data storage based on their depicted portions of the construction project.

However, depending on the implementation, this comparison between two-dimensional drawings may be a slow cumbersome process or may fail altogether, which results in a poor user experience. For instance, in some cases, one or both of the two-dimensional technical drawings under comparison may have hundreds, if not thousands, of lines. This may require an overwhelming number of computing resources to resolve, making comparison using traditional computer vision and matching techniques a slow process. In other cases, one of the two-dimensional technical drawings may be at a different size, scale, or rotation than the other two-dimensional technical drawing, which may also result in a slow process as well.

To address these problems (among others) with existing technology for comparing two two-dimensional drawings, disclosed herein is new software technology for comparing and matching two two-dimensional technical drawings. For instance, in one respect, disclosed herein is a software tool that engages in an image feature matching technique, which, in some examples, may be used to determine whether two (or more) two-dimensional technical drawings depict the same portion of a construction project, such as the same floor of a building. Advantageously, the disclosed image feature matching technique may make this determination even if the two (or more) two-dimensional technical drawings are of different scales, have different angular rotations, or include annotations or other minor variations from one another.

Accordingly, in one aspect, disclosed herein is a computer-implemented method that involves (i) accessing a plurality of two-dimensional drawings representative of a construction project, (ii) for each respective two-dimensional drawing of the plurality of two-dimensional drawings, determining a plurality of candidate pixel regions, (iii) identifying, from among the plurality of candidate pixel regions, a set of landmark pixel regions that appear in the plurality of two-dimensional drawings at a threshold rate, wherein a first two-dimensional drawing of the plurality of two-dimensional drawings includes a first subset of landmark pixel regions from among the set of landmark pixel regions, and wherein a second two-dimensional drawing of the plurality of two-dimensional drawings includes a second subset of landmark pixel regions from among the set of landmark pixel regions, (iv) comparing the first subset of landmark pixel regions with the second subset of landmark pixel regions to thereby identify a subset of shared landmark pixel regions that appear in both the first two-dimensional drawing and the second two-dimensional drawing, (v) projecting the first two-dimensional drawing and the second two-dimensional drawing onto a projection space such that one or more of the shared landmark pixel regions from the first two-dimensional drawing align with one or more of the shared landmark pixel regions from the second two-dimensional drawing, and (vi) determining an extent of similarity between the projected first and second two-dimensional drawings in the projection space to thereby determine whether the first two-dimensional drawing and the second two-dimensional drawing depict the same portion of the construction project.

In another aspect, disclosed herein is a computing system that comprises at least one processor, a non-transitory computer-readable medium, and program instructions stored on the non-transitory computer-readable medium that are executable by the at least one processor to cause the computing system to carry out the operations disclosed herein, including but not limited to the operations of the foregoing method.

In yet another aspect, disclosed herein is a non-transitory computer-readable medium comprising program instructions that are executable to cause a computing system to carry out the operations disclosed herein, including but not limited to the operations of the foregoing method.

One of ordinary skill in the art will appreciate these as well as numerous other aspects in reading the following disclosure.

BRIEF DESCRIPTION OF THE DRAWINGS

Please note that this patent or application file contains at least one drawing executed in color. Copies of this patent or patent application publication with color drawing(s) will be provided by the Office upon request and payment of the necessary fee.

FIG. 5A depicts an example two-dimensional drawing, in accordance with one embodiment of the present disclosure.

FIG. 5B depicts an example two-dimensional drawing, in accordance with one embodiment of the present disclosure.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. EXAMPLE SYSTEM CONFIGURATION

The present disclosure is generally directed to a software tool for engaging in image feature matching between two two-dimensional drawings. The disclosed software tool may be used in many different contexts, one of which is in connection with technology for managing construction projects. As one possible implementation, this software technology may include both front-end software running on client stations that are accessible to individuals associated with construction projects (e.g., contractors, project managers, architects, engineers, designers, etc.) and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management of the construction project, which may take various forms. According to some implementations, these tasks may include: rendering three-dimensional views of the construction project, navigating through the various three-dimensional views of the construction project in order to observe the construction project from various perspectives, and using the software to generate two-dimensional drawings, as some non-limiting examples. Further, such front-end client software may take various forms, examples of which may include a native application (e.g., a mobile application) and/or a web application running on a client station, among other possibilities.

Figure 1:
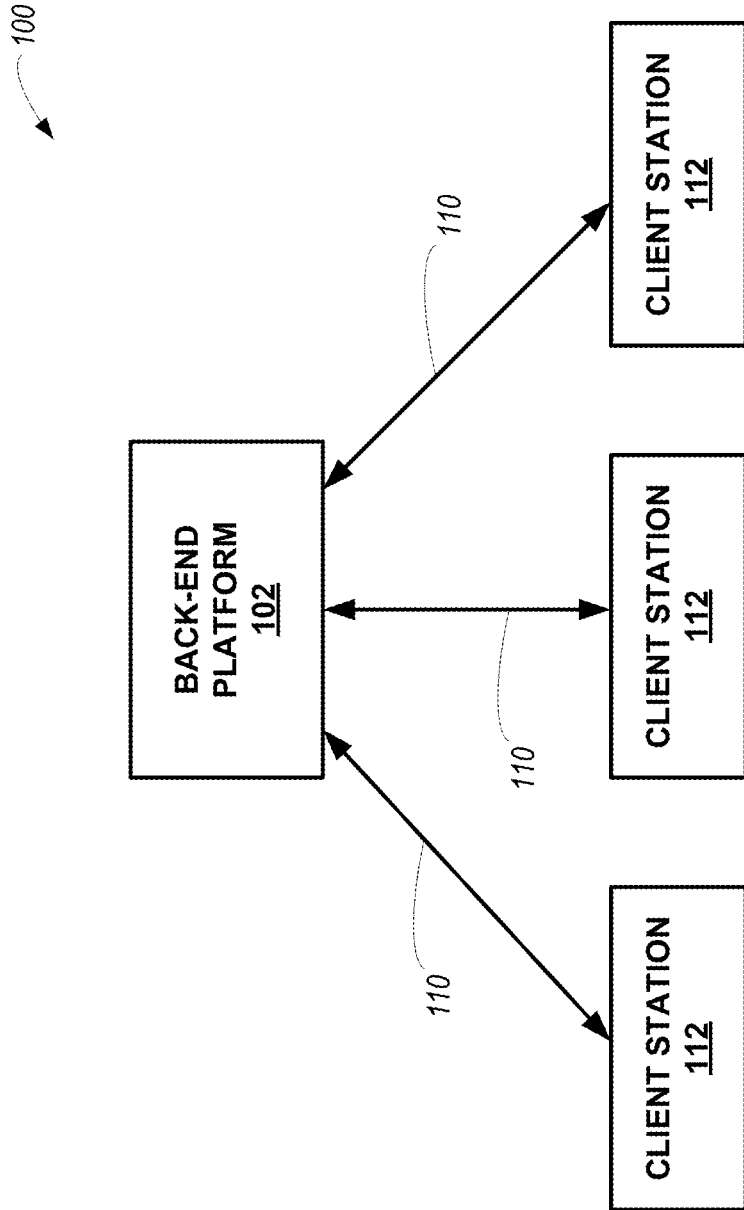
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as client stations 112.

Broadly speaking, back-end platform 102 may comprise one or more computing systems that have been provisioned with software for carrying out one or more of the functions disclosed herein, including but not limited to rendering three-dimensional views of models of a construction project, and/or transmitting data and/or instructions that cause one or more client stations 112 to output information related to a construction project, including the rendered views of the three-dimensional model of the construction project. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with client stations 112 over respective communication paths 110. In this respect, each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 between client stations 112 and back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

In practice, client stations 112 may each be operated by and/or otherwise associated with a different individual that is associated with a construction project. For example, an individual tasked with the responsibility for creating project-related data, such as data files defining three-dimensional models of a construction project may access one of the client stations 112, whereas an individual tasked with the responsibility for reviewing and revising data files defining three-dimensional models of a construction project may access another client station 112, whereas an individual tasked with the responsibility for performing work related to project-related data, such as an on-site construction professional may access yet another client station 112. However, client stations 112 may be operated by and/or otherwise associated with individuals having various other roles with respect to a construction project as well. Further, while FIG. 1 shows an arrangement in which three particular client stations are communicatively coupled to back-end platform 102, it should be understood that an arrangement may include more or fewer client stations.

Although not shown in FIG. 1, back-end platform 102 may also be configured to receive project-related data from one or more external data sources, such as an external database and/or another back-end platform or platforms. Such data sources—and the project-related data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. EXAMPLE COMPUTING DEVICE

Figure 2:
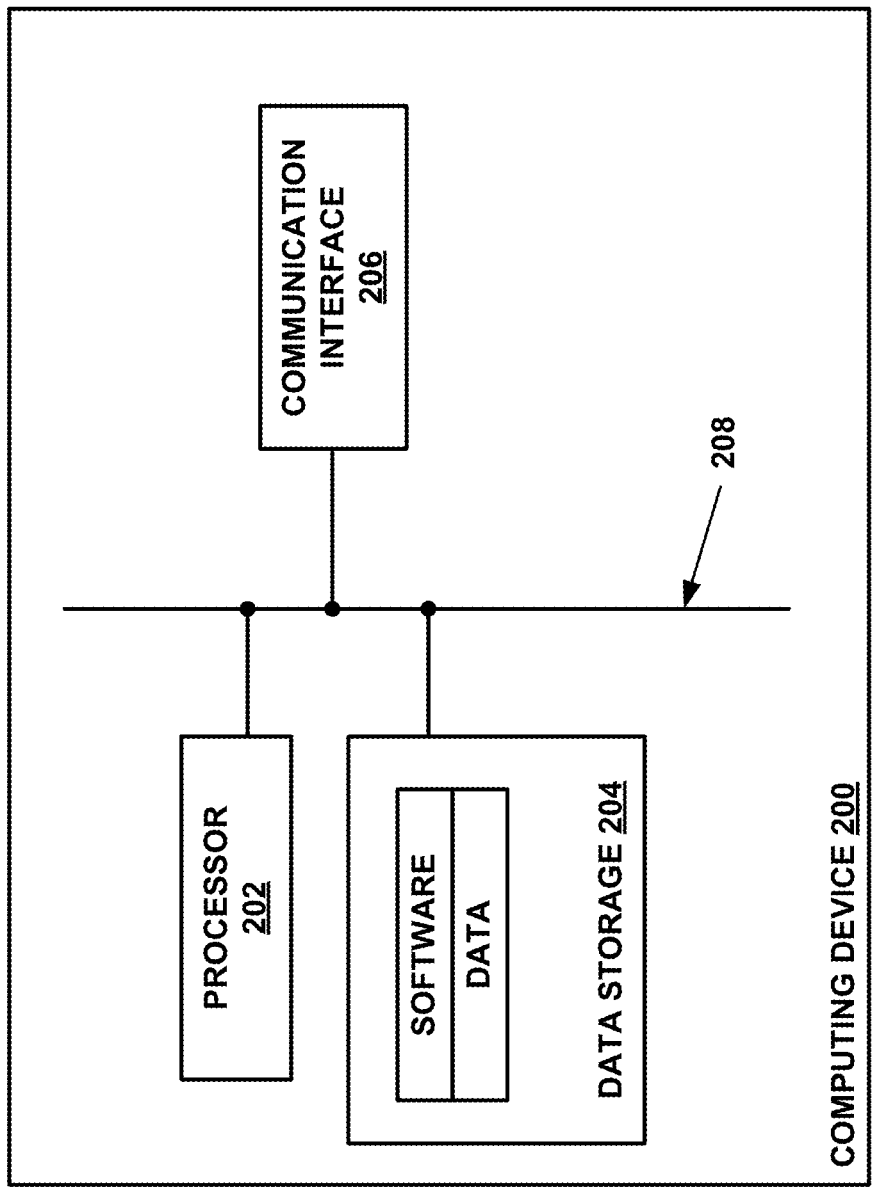
FIG. 2 depicts an example computing platform that may be configured to carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the computing device 200 to carry out the operations disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with other computing devices or systems, such as one or more client stations 112 when computing device 200 serves as back-end platform 102, or as back-end platform 102 when computing device 200 serves as one of client stations 112. As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more other interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. EXAMPLE VISUAL REPRESENTATIONS OF CONSTRUCTION PROJECTS

As mentioned above, one aspect of managing a construction project involves the creation, review, and sometimes revision, of plans for the construction project. These plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering schematics, or construction blueprints, among others. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process. Set forth below is a short overview of each of these types of visual representations of construction projects.

A. Two-Dimensional Technical Drawings

Figure 3:
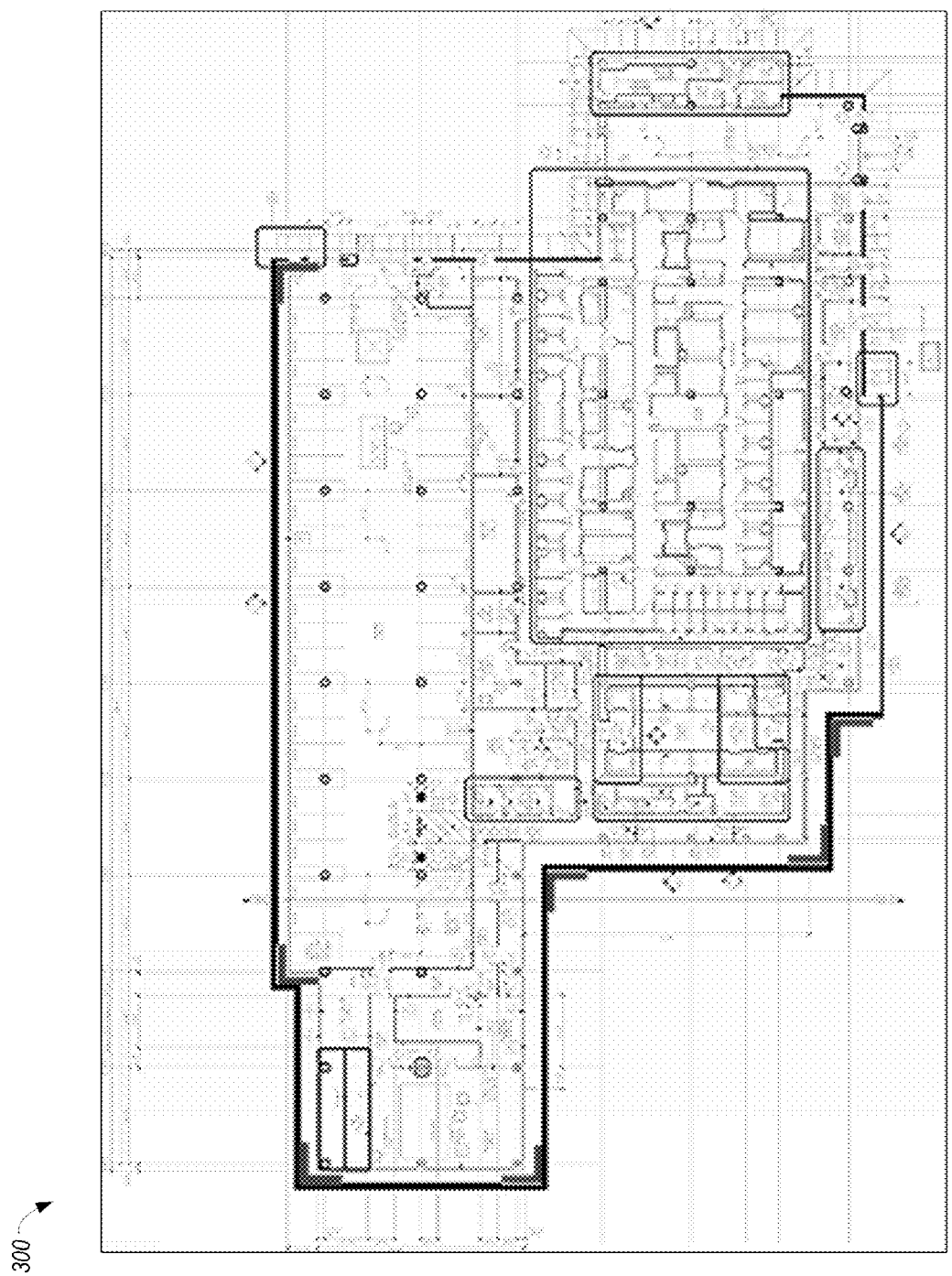
FIG. 3 depicts an example two-dimensional technical drawing.

As mentioned, one way to visually represent information about a construction project is through two-dimensional technical drawings. Generally, a two-dimensional technical drawing serves to visually communicate a limited amount of information about the construction project in order to aid in the construction, or the further design, of the project. To illustrate, FIG. 3 depicts one example of a two-dimensional technical drawing in the form of an architectural drawing 300, which may visually communicate how the construction project is laid out. To do this, an architectural drawing, such as architectural drawing 300 may comprise a scaled drawing depicting certain foundational elements of the construction project (e.g., floors, walls, ceilings, doorways, and support elements), with perhaps visual indications of additional relevant aspects of these foundational elements, such as measurements, dimensions, materials, etc.

Another example of a two-dimensional technical drawing is a schematic that visually communicates how the heating, ventilation, and air conditioning (HVAC) ductwork is routed throughout the building. Like the architectural drawing, this schematic may visually communicate the HVAC ductwork routing through the use of a scaled depiction of the ductwork along with indications of other relevant aspects of the ductwork, such as measurements, dimensions, materials, etc.

Because technical drawings such as these are limited to two dimensions, multiple technical drawings may be used when there is a need to visually communicate aspects from a third (e.g., vertical) dimension. For instance, a construction project may comprise multiple floors and the design of the project may call for the shape or structure to change from floor to floor. In such a case, there may be one (or more) technical drawings for each floor of the construction project. And although just two example types of technical drawings were mentioned above, a typical construction project may involve the use of many other types of other technical drawings, including for instance technical drawings associated with landscaping, electrical, plumbing, installation, etc. For these reasons, a single construction project may involve the use of tens, hundreds, or perhaps, thousands of technical drawings.

Generally, two-dimensional technical drawings, like the two examples described above, are created at the outset of a construction project by architects, designers, engineers, or some combination thereof. Traditionally, these professionals would construct such two-dimensional technical drawings by hand. But today, professionals typically construct two-dimensional technical drawings with the aid of computer drafting software, such as existing CAD software known and used by professionals in the industry.

Two-dimensional technical drawings have advantages. For instance, a single two-dimensional technical drawing can visually communicate vast amounts of useful information. In some cases, construction professionals can get an overview of an entire area of a construction project by referring to a single technical drawing. Moreover, once created, technical drawings require a relatively small amount of computer storage and processing power to store and view. Construction professionals can often review finished technical drawings with off-the-shelf software document viewers, such as portable document format (PDF) software viewers.

Yet two-dimensional technical drawings have certain limitations. For instance, because these technical drawings are typically created at the outset of the construction project—that is, well before construction has actually begun—these drawings generally will not reflect changes to the project that happen during, say, the construction phase. When a change to the construction project happens after the technical drawings are completed, architects, designers, or engineers may be called upon to revise the existing technical drawings or create new drawings altogether to reflect the change.

Additionally, technical drawings that are generated at the outset of the construction project may not always visually communicate the specific information desired by the construction professional who later accesses the technical drawings. For instance, during construction a construction professional may determine that it would be useful to have a technical drawing, such as an architectural plan, that shows only support structures made of concrete and does not show support structures made from other materials, such as steel. But such a technical drawing may not be readily accessible because the complete set of technical drawings may have been already completed by that point. Thus, the construction professional may have to wait, or go without, his or her desired technical drawing. As mentioned, one solution to this issue would be to call upon an engineer, designer, or architect to regenerate the technical drawings with this requested information. But this is often a costly and time-consuming process, which may not be feasible depending on the project's budget as well as the stage of construction.

Still additionally, two-dimensional technical drawings tend to lack real coordinate information. For instance, a construction project is typically associated with what is referred to as a "real coordinate system." This real coordinate system may generally be a system of coordinates in three space and expressed in real units (e.g., feet or meters). At the outset of a project, a planner may apply a real coordinate system to a construction project, such that any location within the construction project can be expressed in terms of the real coordinate system. As an example, in the physical space in which the project will be constructed, a planner may arbitrarily select one corner of this space to be the origin (i.e., the (0, 0, 0) coordinate), and may select one direction to be the "X" direction, one direction to be the "Y" direction, and one direction to be the "Z" direction. Thus, when, for example, reference is made to a location at (15, 50, 50), construction professionals will understand that reference is being made to a location in the physical space in which the project will be constructed that is 15 feet in the X-direction, 50 feet in the Y-direction, and 50 feet in the Z-direction away from the origin location. In addition to making reference to actual locations within the physical space in which the project will be constructed, construction professionals may also understand that if reference is made to a physical element (such as a wall) that begins at real X-Y coordinates (150, 900) and spans to real X-Y coordinate (150, 1100), that physical element is 200 feet long. Other units are possible as well.

As mentioned, however, two-dimensional technical drawings may not be expressed in this real coordinate system or otherwise indicate what the real coordinates are of any physical elements depicted the two-dimensional drawings. Instead, two-dimensional drawings may be expressed in what is referred to as a "pixel coordinate system." In a pixel coordinate system, each pixel in the drawing can be represented by an X-Y coordinate representing how many pixels away that pixel is from an arbitrary origin pixel, typically the first pixel in one of the corners of the drawing. Thus, for a line on a two-dimensional drawing depicting a physical element of the construction project (e.g., a wall), a construction professional can determine how many pixels long such an element is but typically cannot readily determine how long that element is in real units (e.g., feet or meters).

B. Three-Dimensional Visual Representations

As also mentioned, another way to visually represent information about a construction project is through a computerized, three-dimensional model of the construction project. In order to facilitate the creation and use of a computerized, three-dimensional model of the construction project, a team of architects, designers, and/or engineers engage in a process referred to as Building Information Modeling.

As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on that file or those files, is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for this building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project (e.g., an air duct) as a mesh of geometric triangles such that when the geometric triangles are visually stitched together by BIM viewer software, the triangles form a mesh, which represents a scaled model of the physical component (e.g., the air duct). In this respect, the BIM file may contain data that represents each triangle of a given mesh as set of coordinates in three-space. For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). In some BIM implementations, these coordinates are expressed in the real coordinate system of the construction project. A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

Figure 4:
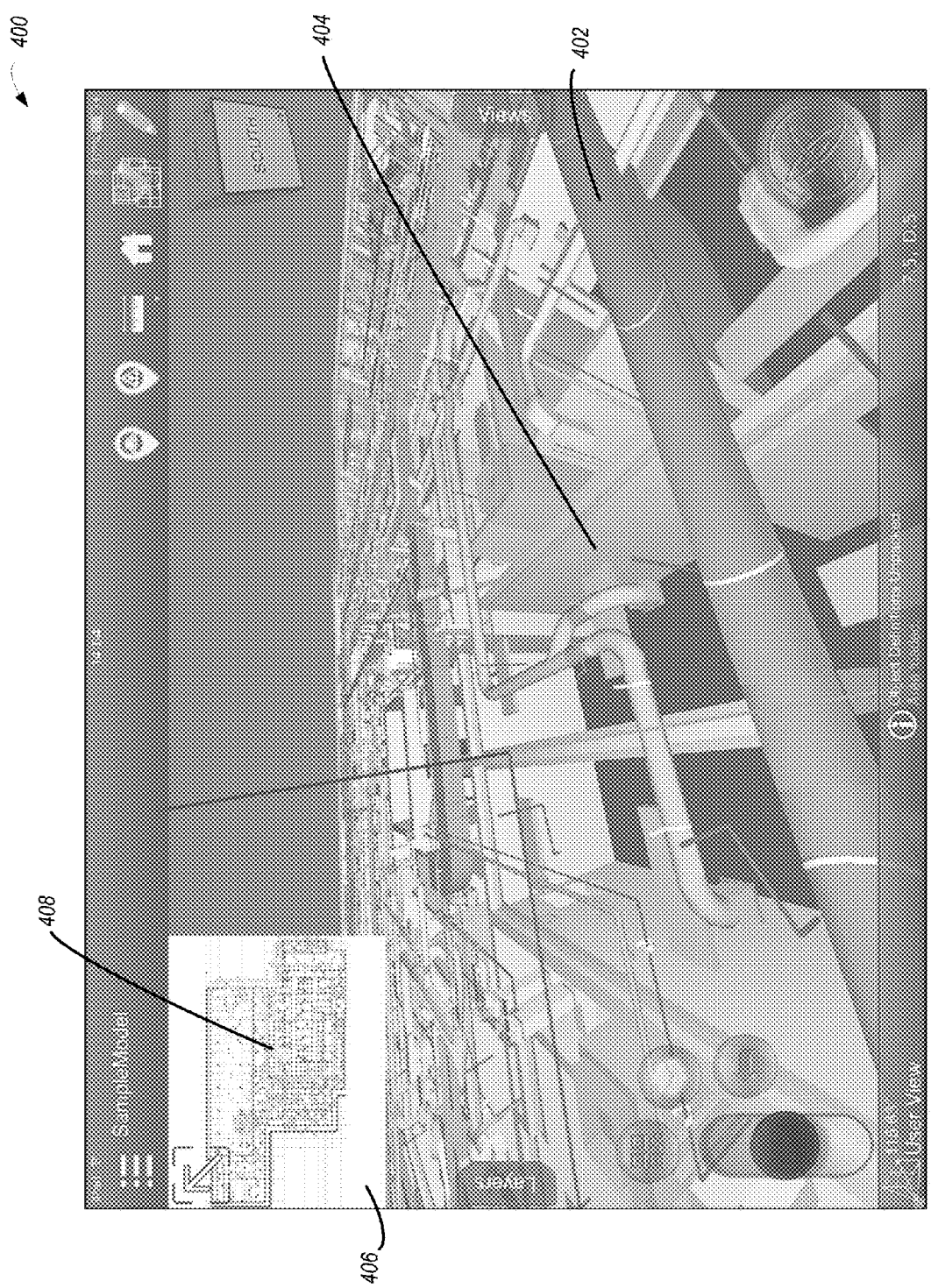
FIG. 4 depicts an example three-dimensional BIM view, in accordance with one embodiment of the present disclosure.

To illustrate one example of a three-dimensional view, FIG. 4 depicts an example snapshot 400 of a GUI, which includes a three-dimensional view of a construction project rendered at a particular perspective. Snapshot 400 may be generated by, for instance, a software tool running on a client station, such as one of client stations 112 (FIG. 1), accessing a BIM file, and then rendering a three-dimensional view of the construction project based on that BIM file and presenting it via a display interface of that client station. Alternatively, a back-end platform, such as back-end platform 102 (FIG. 1) may access a BIM file and may generate a set of instructions for rendering a three-dimensional view of the construction project based on that BIM file. Back-end platform 102 may then send these instructions to one of client stations 112, which in turn may present a three-dimensional view of the construction project it via a display interface of that client station based on these instructions. Still other arrangements are possible.

As depicted, snapshot 400 includes a three-dimensional view of a construction project from a particular perspective. The three-dimensional view depicted in FIG. 4 includes a number of meshes that represent individual physical components of the construction project, such as floors, walls, pipes, and ducts, etc. In particular, depicted in FIG. 4 is, among others, a mesh 402, which represents an air duct, and a mesh 404, which represents a wall. Of course, in other examples, other meshes are possible as are other layouts and designs of construction projects.

The client station presenting snapshot 400 may be configured to adjust the perspective at which the three-dimensional view is presented in response to, for instance, receiving user inputs at the client station. The client station may do this in various ways. As one possibility, the client station may reposition the perspective either forward or backward along an x-axis of the model in response to receiving a first type of user input via a peripheral, such as pressing the up arrow or down arrow on a keyboard or a click and drag with a mouse. The client station may reposition the perspective laterally along a y-axis of the model in response to receiving a second type of user input via a peripheral, such as pressing the left arrow or right arrow on a keyboard or a different type of click and drag with a mouse. The client station may reposition the perspective either up or down along a z-axis of the model in response to receiving a third type of user input via a peripheral, such as pressing a combination of keys on a keyboard (e.g., the Control key and the up arrow, or the Control key and the down arrow) or yet a different type of click and drag with a mouse. The client station may reposition the orientation of the perspective (i.e., the "camera" angle) in response to receiving a fourth type of user input via a peripheral, such as pressing a combination of keys on a keyboard (e.g., the Alt key and the up arrow, or the Control key and the down arrow) or yet a different type of click and drag with a mouse.

As another possibility, the computing device may reposition the perspective simultaneously along a combination of one or more of the x-axis, the y-axis, and the z-axis of the model in response to receiving a first type of user input at a touch-screen of the computing device, such as a touch and drag gesture made with one finger. The computing device may reposition the orientation of the perspective in response to receiving a second type of user input at a touch-screen of the computing device, such as a touch and drag gesture made with two fingers. However, other examples of adjusting the perspective at which the three-dimensional view is presented are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

BIM technology has advantages. For instance, as described, BIM viewers can use BIM files in order to render three-dimensional views (such as the view depicted in snapshot 400 in FIG. 4) of various elements of the construction project. This can help construction professionals identify potential construction issues prior to encountering those issues during construction as well as conceptualize what the finished building will look like.

Further, BIM files can be used to generate two-dimensional drawings of portions of a construction project. For instance, some BIM viewer technology provides the capability to generate a top-down two-dimensional drawing of a portion of a construction based on a particular 3D BIM view of that portion of the construction project. If the BIM file contains information regarding the real coordinate system of the construction project, then this real coordinate system data may be translated onto the generated top-down two-dimensional drawing. This top-down two-dimensional drawing may then be compared to one or more traditional two-dimensional technical drawings, such as a PDF construction plan or blueprint (which, as mentioned above, may be expressed in a pixel coordinate system), in order to assess whether the two-dimensional technical drawing depicts or describes the same portion of the construction project being displayed by the 3D BIM viewer. If the two-dimensional technical drawing depicts or describes the same portion of the construction project, then the real coordinate system from the BIM file can be mapped onto the two-dimensional technical drawing, which may provide several advantages for construction professionals, including the ability to supplement the two-dimensional technical drawing with additional measurement information or even information that may have been tagged to a real coordinate location on another two-dimensional technical drawing.

IV. EXAMPLE OPERATIONS

As noted above, there may be various scenarios in which it may be useful to compare two-dimensional drawings to each other. As one example, a construction professional may wish to compare two-dimensional drawings to one another to determine which drawings depict the same portion of the construction project for purposes of organizing the drawings in a data storage based on their depicted portions of the construction project. As another example, a construction professional may wish to identify differences between a pair of two-dimensional drawings that depict the same portion of the construction project. For instance, the two drawings may include an original drawing and a revised drawing of the portion of the construction project, and the construction professional may wish to identify the revisions that were made to the original drawing by comparing the two drawings. And as yet another example, it may be useful to compare a traditional two-dimensional technical drawing to a top-down drawing generated by a BIM viewer in order to assess whether the two-dimensional technical drawing depicts or describes the same portion of the construction project being displayed by the 3D BIM viewer. These examples are meant for illustrative purposes, and there are a variety of other reasons to compare two-dimensional drawings that are also contemplated herein.

However, depending on the implementation, this comparison between two-dimensional drawings may be a slow cumbersome process or may fail altogether, which results in a poor user experience. For instance, in some cases, one or both of the two-dimensional technical drawings under comparison may have hundreds, if not thousands, of lines. This may require an overwhelming number of computing resources to resolve, making comparison using traditional computer vision and matching techniques a slow process. In other cases, one of the two-dimensional technical drawings may be at a different size or scale than the other two-dimensional technical drawing, which may also result in a slow process as well.

FIGS. 5A and 5B illustrate the difficulty of comparing two-dimensional drawings to identify differences between the drawings. As shown, FIG. 5A depicts a first two-dimensional drawing 500, and FIG. 5B depicts a second two-dimensional drawing 502. The first drawing 500 and the second drawing 502 are of the same portion of a construction project, but the first drawing 500 includes an additional feature 504 that is not present in the second drawing 502. Manually identifying this difference could take hours, and using traditional image comparison techniques, such as a pixel-by-pixel comparison may fail to provide useful results if one of the drawings is even slightly translated, rotated, or dilated relative to the other. To address these difficulties, an improved solution is described below.

Disclosed herein is new software technology that is designed to help remedy some of the aforementioned limitations with technology for matching two two-dimensional technical drawings. For instance, disclosed herein is a software tool that engages in an image feature matching technique. In one example implementation, the disclosed matching technique may be used to determine whether two (or more) two-dimensional technical drawings depict the same portion of a construction project, such as the same floor of a building. Advantageously, the disclosed image feature matching technique may make this determination even if the two (or more) two-dimensional technical drawings are of different scales, have different angular rotations, or include annotations or other minor variations from one another.

Example operations that may be carried out by one or more computing devices running the disclosed software tool are discussed in further detail below. For purposes of illustration only, these example operations are described as being carried out by a computing device, such as computing device 200 (FIG. 2), which as described above, may serve as one or more of client stations 112 (FIG. 1) and/or back-end platform 102 (FIG. 1). In this respect, it should be understood that, depending on the implementation, the operations discussed herein below may be carried out entirely by a single computing device, such as one or more of client stations 112 or by back-end platform 102, or may be carried out by a combination of computing devices, with some operations being carried out by back-end platform 102 (such as computational processes and data-access operations) and other operations being carried out by one or more of client stations 112 (such as display operations and operations that receive user inputs). However, other arrangements are possible as well.

To help describe some of these operations, flow diagrams may also be referenced to describe combinations of operations that may be performed by a computing device. In some cases, a block in a flow diagram may represent a module or portion of program code that includes instructions that are executable by a processor to implement specific logical functions or steps in a process. The program code may be stored on any type of computer-readable medium, such as non-transitory computer readable media (e.g., data storage 204 (FIG. 2)). In other cases, a block in a flow diagram may represent circuitry that is wired to perform specific logical functions or steps in a process. Moreover, the blocks shown in the flow diagrams may be rearranged into different orders, combined into fewer blocks, separated into additional blocks, and/or removed, based upon the particular embodiment. Flow diagrams may also be modified to include additional blocks that represent other functionality that is described expressly or implicitly elsewhere herein.

Figure 6:
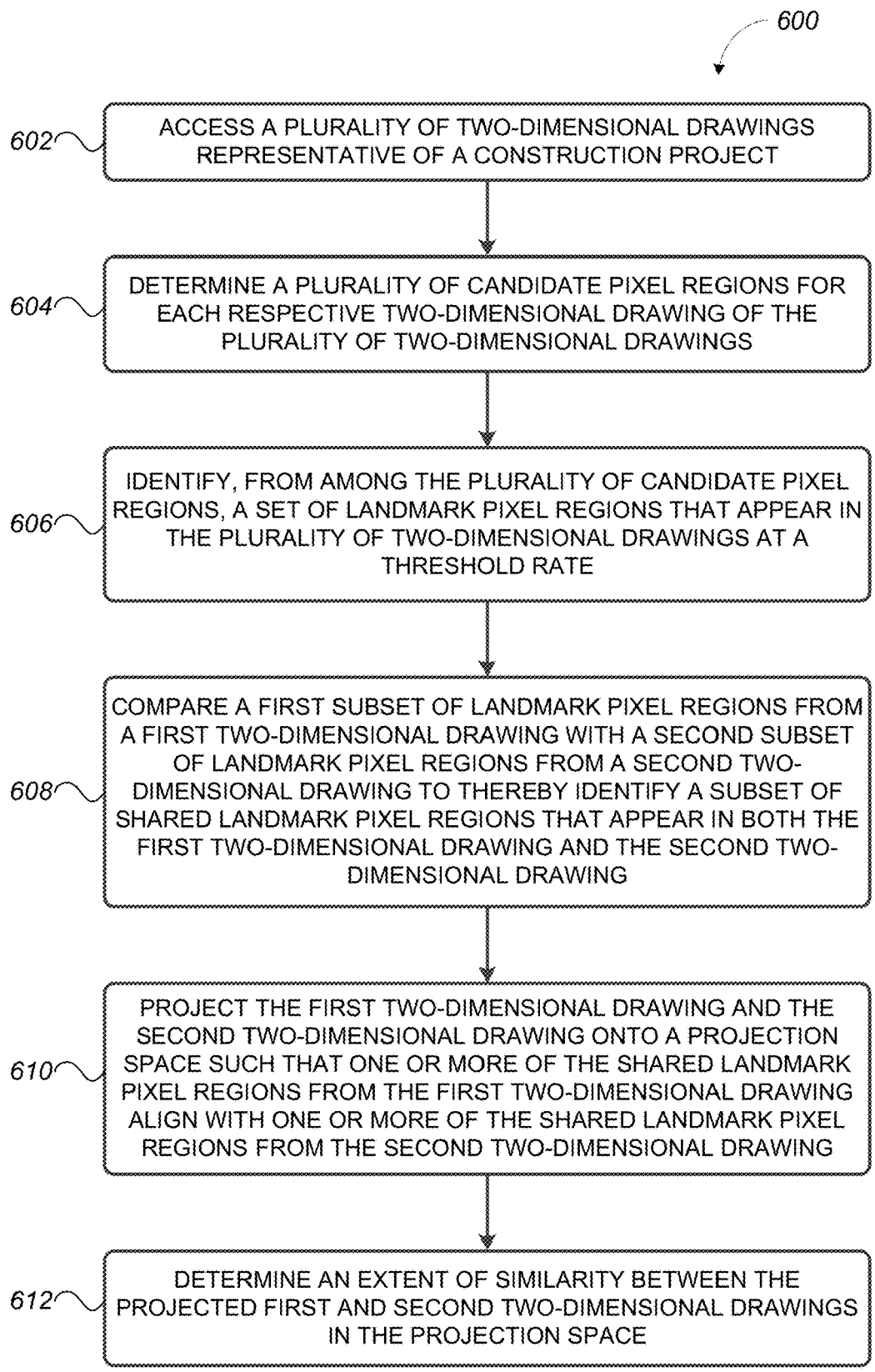
FIG. 6 is a flow diagram depicting example operations for matching two two-dimensional drawings, according to one embodiment of the present disclosure.

With reference now to flow diagram 600 of FIG. 6, one example of a process carried out in accordance with the disclosed software tool for engaging in an image feature matching technique is illustrated and described. In practice, this process may be commenced while the computing device is presenting a two-dimensional technical drawing or a three-dimensional BIM view via a GUI. For example, in a scenario in which a user has requested generation of a top-down two-dimensional drawing based on a displayed three-dimensional BIM view, one aspect of this generation may involve a comparison to another technical drawing, such as a construction blueprint or other two-dimensional technical drawing in order to confirm that the generated top-down two-dimensional drawing and the other two-dimensional technical drawing depict the same portion of the construction project. Thus, at an appropriate point in the course of such generation, the computing device may commence the following process. However, other ways to commence the process are possible as well.

Once the process is commenced, the process may generally involve the following operations: (i) at block 602, the computing device accesses a plurality of two-dimensional drawings representative of a construction project; (ii) at block 604, the computing device determines a plurality of candidate pixel regions for each respective two-dimensional drawing of the plurality of two-dimensional drawings; (iii) at block 606, the computing device identifies, from among the plurality of candidate pixel regions, a set of landmark pixel regions that appear in the plurality of two-dimensional drawings at a threshold rate, which involves identifying a first subset of landmark pixel regions in a first two-dimensional drawing and a second subset of landmark pixel regions in a second two-dimensional drawing; (iv) at block 608, the computing device compares the first subset of landmark pixel regions with the second subset of landmark pixel regions to thereby identify a subset of shared landmark pixel regions that appear in both the first two-dimensional drawing and the second two-dimensional drawing; (v) at block 610, the computing device projects the first two-dimensional drawing and the second two-dimensional drawing onto a projection space such that one or more of the shared landmark pixel regions from the first two-dimensional drawing align with one or more of the shared landmark pixel regions from the second two-dimensional drawing; and (vi) at block 612, the computing device determines an extent of similarity between the projected first and second two-dimensional drawings in the projection space. Each of these operations will now be discussed in further detail.

At block 602, the computing device may access or retrieve from data storage a plurality of two-dimensional technical drawing files, such as CAD drawings or architectural plans that exist in electronic form (e.g., PDF). For instance, as one possibility, the computing device may access the technical drawing files in response to receiving a user input directing the computing device to the location in data storage of the technical drawing files. However, other ways of accessing the technical drawing files from data storage are possible as well.

At block 604, the computing device may determine a plurality of candidate pixel regions for each respective two-dimensional drawing of the plurality of two-dimensional drawings. As will be discussed in further detail below, the computing device may analyze these candidate pixel regions to identify common image features that are present in at least a threshold number of the two-dimensional drawings. These common image features may sometimes be referred to herein as "landmarks," and the computing device may use these landmarks to determine similarities and differences between the two-dimensional drawings, which will also be discussed in further detail below.

Figure 7:
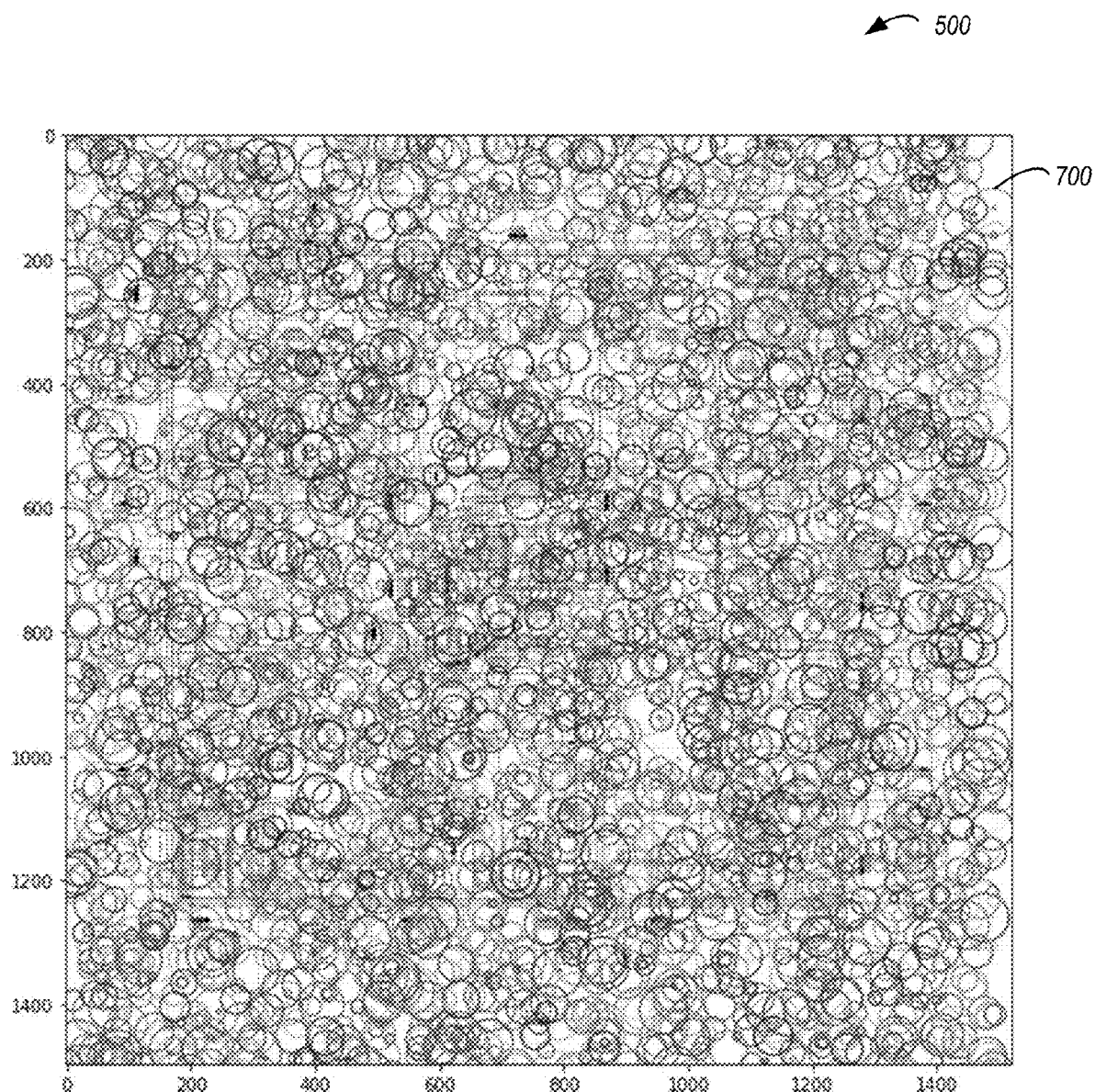
FIG. 7 depicts an example two-dimensional drawing, in accordance with one embodiment of the present disclosure.

To help illustrate one example of this, FIG. 7 depicts the two-dimensional drawing 500 from FIG. 5A after the computing device has determined the candidate pixel regions 700 for the drawing 500. As shown, the candidate pixel regions 700 are represented by multiple circular regions of pixels. The candidate pixel regions 700 can take various shapes or forms, such as squares, rectangles, ovals, or amorphous shapes. However, while it is not necessary for the regions to be circular, defining the candidate pixel regions 700 as circular may be advantageous at least for the reason that circular regions may account for rotational differences between drawings, as will be discussed in further detail below.

The computing device may determine the candidate pixel regions 700 using random or pseudorandom processes. For instance, the computing device may use a random number generator or a pseudorandom number generator to generate an x-coordinate and a y-coordinate corresponding to a particular pixel in the two-dimensional drawing 500, and the computing device may define one of the candidate pixel regions 700 around that particular pixel. In implementations where the candidate pixel regions 700 are circular regions, the computing device may define one of the candidate pixel regions 700 as a predefined number of pixels that form a circular region centered around the particular pixel. In some implementations, the predefined number of pixels falls within the range of 10 pixels to 10,000 pixels, inclusive, but other examples are possible as well. As shown in FIG. 7, the computing device may define candidate pixel regions 700 of different sizes. To facilitate this, the computing device can randomly or pseudorandomly select the number of pixels from the predefined range of pixels to include in a given candidate pixel region 700. The computing device may repeat this process for generating all of the candidate pixel regions 700 of the two-dimensional drawing 500, and the computing device may similarly repeat this process for each two-dimensional drawing associated with the construction project.

As further depicted in FIG. 7, the computing device may generate numerous candidate pixel regions 700 for each two-dimensional drawing. In some implementations, the computing device may generate hundreds or thousands of candidate pixel regions 700 for each two-dimensional drawing. In practice, more candidate pixel regions 700 may provide for more accurate comparisons between drawings, as will be described in further detail below. However, more candidate pixel regions 700 also results in the expenditure of additional computing resources, which may delay the comparison process. As such, the number of candidate pixel regions 700 generated for each drawing should be large enough to provide accurate comparison results but small enough that the comparison process can be completed relatively quickly using available computational resources. In some implementations, the computing device may generate 1,000 candidate pixel regions 700 for each two-dimensional drawing. In other implementations, the computing device may generate 5,000 or 10,000 candidate pixel regions 700 for each two-dimensional drawing. In yet other implementations, the computing device may present a user with an option to specify how many candidate pixel regions 700 the computing device will utilize for a given instance. Other examples are possible as well.

Referring back to FIG. 6, at block 606, after the computing device has determined the plurality of candidate pixel regions for each two-dimensional drawing, the computing device may identify, from among the plurality of candidate pixel regions, a set of landmark pixel regions that appear in the plurality of two-dimensional drawings at a threshold rate. As noted above, the landmark pixel regions may coincide with distinctive image features that appear in multiple drawings and, as described in further detail below, that can be used to compare the drawings to determine any differences between the drawings and/or whether the drawings depict the same portion of the construction project. In some implementations, the threshold rate may be a fixed number of drawings, such as 10, 25, or 50 drawings. In other implementations, the threshold rate may be a proportion of the drawings associated with the construction project, such as 10%, 25%, or 50% of the drawings. Other examples are possible as well.

In order to identify the landmark pixel regions from among the candidate pixel regions, the computing device may compare the candidate pixel regions from each drawing to the candidate pixel regions from each of the other drawings. And in order to perform such a comparison, the computing device may determine a set of characteristics for each candidate pixel region. The set of characteristics may include various information that characterizes the pixels included in the candidate pixel region, such as number of pixels, average pixel color value or grayscale value, average pixel color difference or grayscale difference, number or proportion of black pixels or dark pixels (e.g., pixels having a threshold low grayscale value), number or proportion of white pixels or light pixels (e.g., pixels having a threshold high grayscale value), etc.

Once the computing device has determined the set of characteristics for each candidate pixel region, the computing device may compare the sets of characteristics for each candidate pixel region in one drawing to the sets of characteristics for the candidate pixel regions in each of the other drawings. In some implementations, the computing device may perform such comparisons by generating a vector for each candidate pixel region, where the vector includes the set of characteristics for the candidate pixel region. Then the computing device may compare two candidate pixel regions by normalizing the vectors and determining a cosine similarity of the vectors, which involves determining the inner product of the normalized vectors. If the two candidate pixel regions are similar or identical, then their cosine similarity will be close to or equal to one. If the two candidate pixel regions are dissimilar, then their cosine similarity will be close to or equal to zero. Accordingly, in some implementations, the computing device may determine that two candidate pixel regions are sufficiently similar to one another if their cosine similarity is above a threshold value, such as 0.9 or 0.95. Other threshold values can be used as well. The computing device may then identify the landmark pixel regions as the candidate pixel regions that have identical or sufficiently similar candidate pixel regions in at least a threshold number of the two-dimensional drawings.

As noted above, the candidate pixel regions may include regions of various sizes. This may be advantageous for comparing candidate pixel regions in drawings of different scales. For instance, if two different drawings depict the same portion of the construction project, but one of the drawings is drawn at a larger scale than the other, then a candidate pixel region in the larger scale drawing would need to have a larger diameter to coincide with the same image features that coincide with a smaller candidate pixel region in the smaller scale drawing. As such, when determining the candidate pixel regions for each drawing, it may be advantageous for the computing device to generate regions of varying sizes throughout the drawing to better identify landmark pixel regions that appear in drawings of different scales. Other advantages for landmark pixel regions of varying sizes are possible as well.

Further, in some implementations, when identifying the landmark pixel regions, the computing device may disregard certain candidate pixel regions without ever comparing them to other candidate pixel regions. For instance, it may be useful to preemptively discard candidate pixel regions that do not include any distinctive image features that could serve as landmarks for matching drawings. Examples of such candidate pixel regions may include candidate pixel regions that include all white pixels or almost all white pixels, as these pixel regions could potentially be found in any dead space across all the drawings regardless of whether the drawings depict the same portion of the construction project. However, this example is meant to be illustrative, and the computing device may discard candidate pixel regions that have any other sets of characteristics that are common to many of the drawings (e.g., straight lines) regardless of whether the drawings depict the same portion of the construction project as well.

Figure 8:
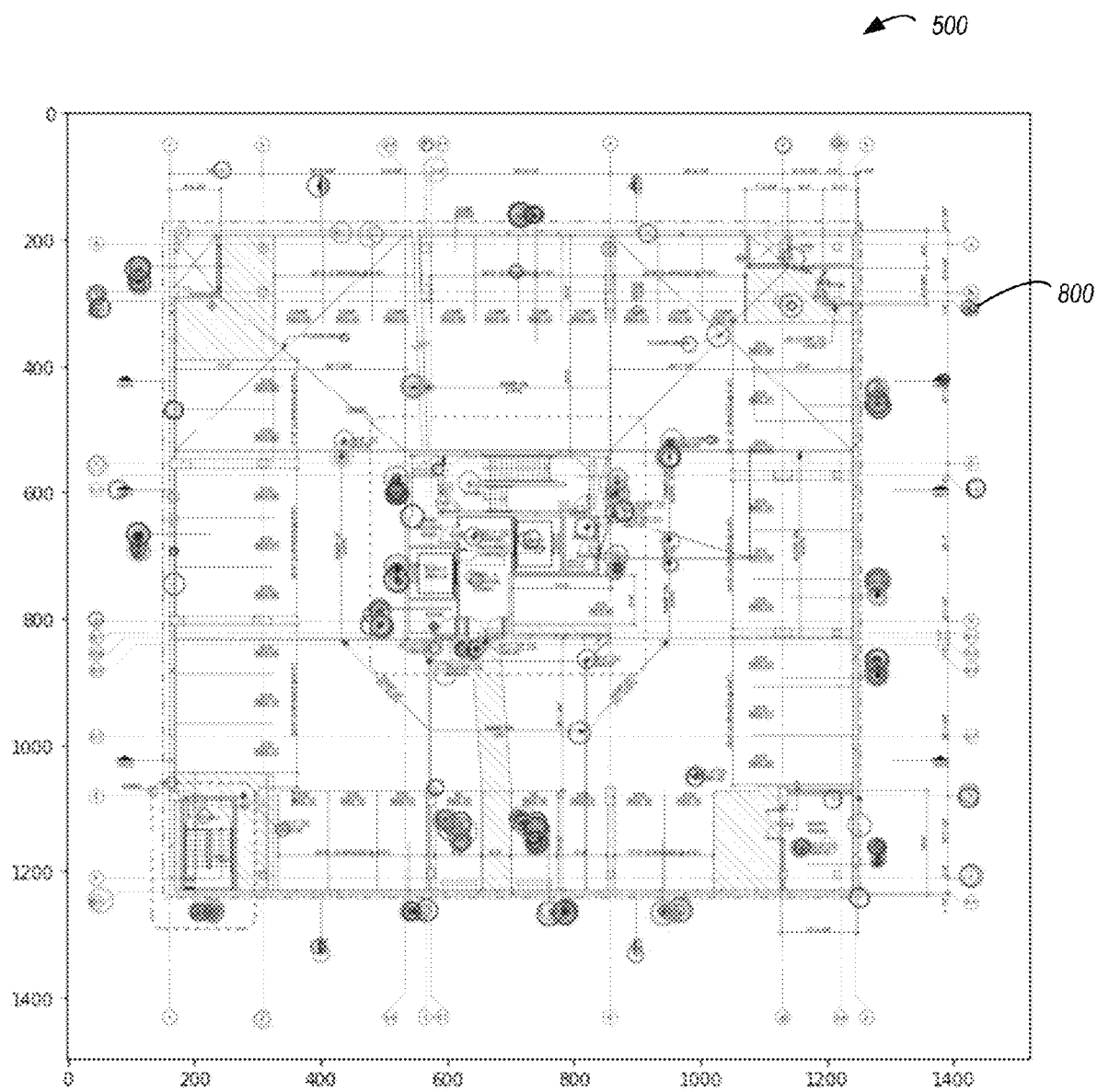
FIG. 8 depicts an example two-dimensional drawing, in accordance with one embodiment of the present disclosure.

FIG. 8 depicts the two-dimensional drawing 500 from FIGS. 5A and 7 after the computing device has identified the landmark pixel regions 800 from among the candidate pixel regions 700 for the drawing 500. In line with the discussion above, the landmark pixel regions 800 correspond to pixel regions that coincide with distinctive image features that appear in the two-dimensional drawings at a threshold rate. The computing device may identify the landmark pixel regions 800 in each of the two-dimensional drawings of the construction project, including the drawing 502 depicted in FIG. 5B.

Once the computing device has identified the landmark pixel regions 800 for the two-dimensional drawings of the construction project, the computing device may use the landmark pixel regions 800 from two of the drawings to compare the two drawings. For instance, referring back to FIG. 6, at block 608, the computing device may compare a first subset of the landmark pixel regions from a first two-dimensional drawing with a second subset of the landmark pixel regions from a second two-dimensional drawing to thereby identify a subset of shared landmark pixel regions that appear in both the first two-dimensional drawing and the second two-dimensional drawing.

Figure 9:
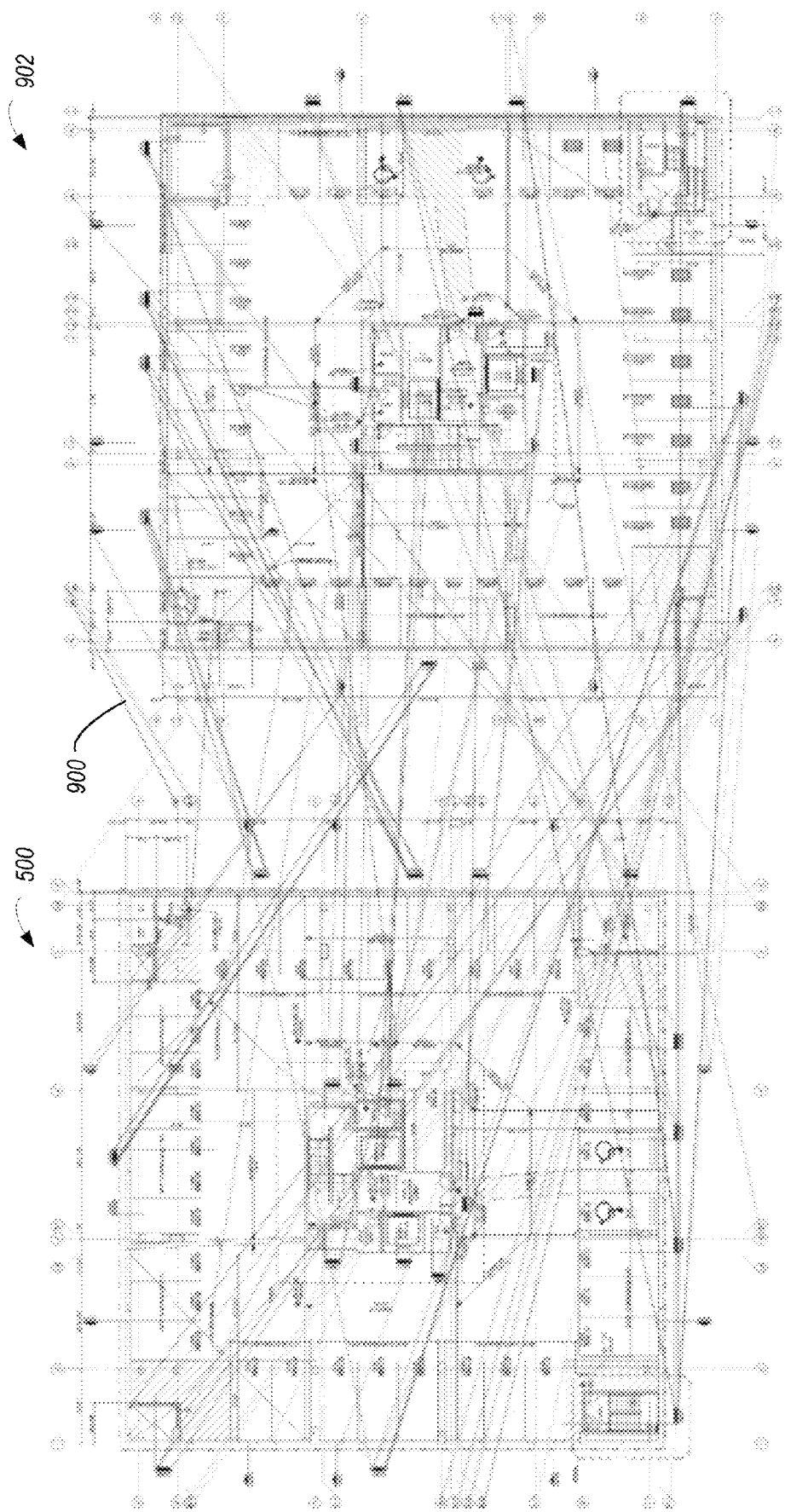
FIG. 9 depicts an example comparison of image features in a pair of two-dimensional drawings, in accordance with one embodiment of the present disclosure.

FIG. 9 depicts a result of the comparison described at block 608 of FIG. 6. As shown, the computing device has identified matches, depicted as lines 900, between landmark pixel regions in the two-dimensional drawing 500 depicted in FIG. 5A and a rotated version 902 of the two-dimensional drawing 500. The computing device may compare the landmark pixel regions from the two drawings using the same or similar comparison process described above in connection with identifying the landmark pixel regions in the first instance. Namely, the computing device may compare the landmark pixel regions in the two drawings by determining the cosine similarity between vectors that characterize the pixel regions based on the identifying information described above. If two landmark pixel regions have a threshold similarity, such as a cosine similarity above a threshold value (e.g., 0.9), then the computing device may identify a match between the two landmark pixel regions— i.e., a shared landmark pixel region that appears in both of the drawings. Otherwise, if two landmark pixel regions do not have the threshold similarity, then the computing device may not identify a match between the landmark pixel regions. In some implementations, the computing device may compare each landmark pixel region in one of the drawings to each landmark pixel region in the other drawing in order to identify all shared landmark pixel regions that appear in both of the drawings.

Referring back to FIG. 6, at block 610, after the computing device has identified the shared landmark pixel regions that appear in both the first and second two-dimensional drawings, the computing device may project the first two-dimensional drawing and the second two-dimensional drawing onto a projection space such that one or more of the shared landmark pixel regions from the first two-dimensional drawing align with one or more of the shared landmark pixel regions from the second two-dimensional drawing. In some implementations, the computing device may treat the coordinate space of the first two-dimensional drawing as the projection space and project the second two-dimensional drawing onto the coordinate space of the first two-dimensional drawing, or vice versa. In other implementations, the computing device may project both the first and second two-dimensional drawings onto a neutral projection space.

When projecting the first and second two-dimensional drawings, the computing device may perform various transformations on the drawings. For instance, the computing device may translate, reflect, rotate, or dilate one or both of the drawings. The computing device may perform whatever combination of these transformations maximizes the number of the shared landmark pixel regions from the first and second two-dimensional drawings that are aligned in the projection space.

The computing device may determine which transformations to apply in various ways. In some implementations, the computing device may use artificial intelligence to transform the drawings. For instance, the computing device may be provided with a machine learning model for projecting the drawings. The model may be trained using various drawings that are known to depict the same portion of the construction project, but that have had various types and extents of the above-described transformations applied to them.

In other implementations, the computing device may use various algorithms to project the drawings onto the projection space. For instance, the computing device may initially determine whether a dilation transformation is appropriate based on the sizes of the shared landmark pixel regions between the two drawings. As an example, the computing device may determine that many (e.g., at least a threshold number), most, or all of the shared landmark pixel regions between the two drawings have different sizes (e.g., a different number of pixels in the shared regions). Based on this determination, the computing device may dilate one or both of the drawings to an extent that results in the largest number of shared landmark pixel regions matching in size.

Once the computing device has adjusted the scales of the drawings through dilation, the computing device may determine the distances between the shared landmark pixel regions. For instance, for a pair of shared landmark pixel regions, the computing device may determine pixel coordinates corresponding to the center of each region, and the computing device may determine the distance between the regions as the distance between the two center points. The computing device may do this for each pair of shared landmark regions. If the determined distances are relatively constant, then the computing device may infer from this that one of the drawings is offset from the other by a fixed distance (e.g., an average of the determined distances), and the computing device may apply a translation to one or both of the drawings to account for this fixed distance. Alternatively, if the determined distances vary significantly, then the computing device may infer from this that one of the drawings is rotated or reflected from the other, and the computing device may apply a rotation or reflection transformation to the drawings.

In the example transformations described above, the computing device may apply the transformations incrementally and reevaluate the distances between the shared landmark pixel regions after each transformation to determine whether the shared landmark pixel regions are getting closer together or farther apart, and the computing device may adjust the transformation accordingly. The computing device may perform these transformations until a set of transformations has been applied that results in a largest number of the shared landmark pixel regions aligning in the projection space.

At block 612, once the computing device has projected the first and second two-dimensional drawings onto the projection space, the computing device may determine an extent of similarity between the projected first and second two-dimensional drawings in the projection space. In some implementations, the computing device may perform a pixel-by-pixel comparison between the first and second two-dimensional drawings. For instance, once the drawings are aligned in the projection space, the computing device may compare a color value or grayscale value of each aligned pixel to determine a numerical distance between each pair of aligned pixels.

Figure 10:
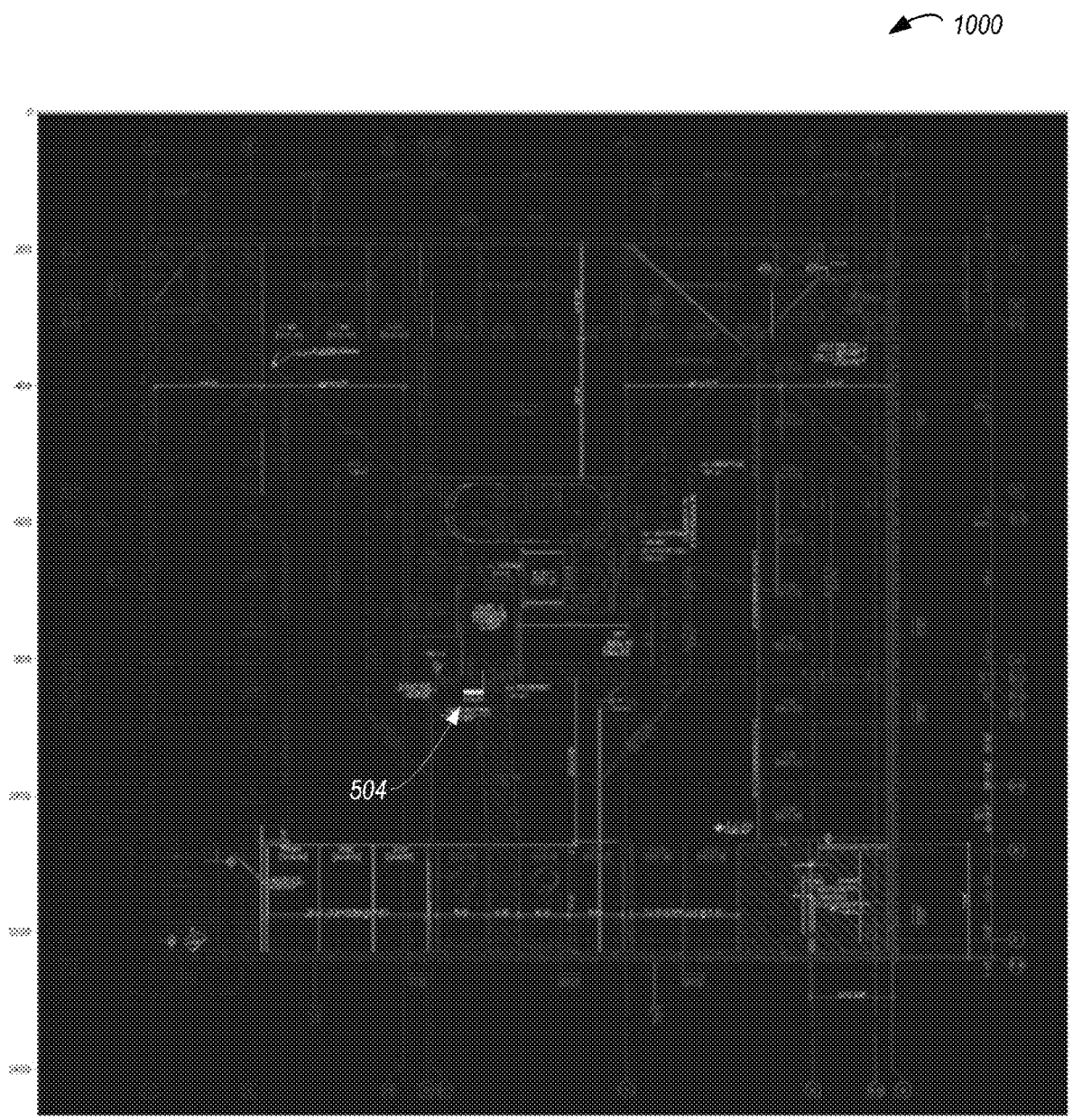
FIG. 10 depicts an example drawings modification detection result based on a comparison of image features in a pair of two-dimensional drawings, in accordance with one embodiment of the present disclosure.

In some implementations, the computing device may output a visual indication of the similarities and differences between the pixels. FIG. 10 depicts an example output 1000 indicating the results of a comparison between the two-dimensional drawing 500 depicted in FIG. 5A and the two-dimensional drawing 502 depicted in FIG. 5B using techniques described herein. As shown in FIG. 10, the computing device may color pixels that exactly match or very closely match with dark tones, and the computing device may highlight pixels that have larger differences with brighter tones. Using this process, it is easy to quickly identify the image feature 504 that is different between the two drawings.

In some implementations, the computing device may assign an overall numerical value to quantify the extent to which the compared drawings match. For instance, as described above, the computing device may determine a numerical distance between each pair of aligned pixels in the compared drawings. If the numerical distance exceeds a threshold value, then the computing device may determine that the two pixels are sufficiently different and therefore do not match. After doing this for each pixel, the computing device may determine the proportion of pixels between the drawings that match. If the proportion is above a threshold number, such as 90%, then the computing device may determine that the two drawings depict the same portion of the construction project. Alternatively, if the proportion of matching pixels is below the threshold number, then the computing device may determine that the two drawings do not depict the same portion of the construction project.

Depending on the implementation, the computing device may use this conclusion of whether the two drawings depict the same portion of the construction project in any number of different ways. As one possibility, the computing device may have been in the process of generating a functional two-dimensional inset to use in connection with a three-dimensional BIM view, such as the process disclosed in co-owned and co-pending U.S. patent application Ser. No. 16/277,679, titled "Generating Technical Drawings From Building Information Models," filed Feb. 15, 2019, which is incorporated by reference herein in its entirety. The computing device may, in practice, use the foregoing process as the "pattern matching technique" referenced in the above-identified co-pending application. And in particular, when the computing device engages in the foregoing process and thereby concludes that a first two-dimensional drawing and a second two-dimensional drawing depict the same portion of a construction project, then the computing device may engage in the remainder of the process steps set forth in the above-identified co-pending application. Other uses of the foregoing process are possible in other contexts as well.

V. CONCLUSION

Example embodiments of the disclosed innovations have been described above. Those skilled in the art will understand, however, that changes and modifications may be made to the embodiments described without departing from the true scope and spirit of the present invention, which will be defined by the claims.

For instance, those in the art will understand that the disclosed operations for engaging in an image feature matching technique to determine whether two (or more) two-dimensional technical drawings depict the same portion of a construction project may be implemented in other construction-related areas. The disclosed operations could be used in other contexts as well.

Further, to the extent that examples described herein involve operations performed or initiated by actors, such as "humans," "operators," "users," or other entities, this is for purposes of example and explanation only. The claims should not be construed as requiring action by such actors unless explicitly recited in the claim language.

I claim:

1. A computing system comprising:
    at least one processor;
    a non-transitory computer-readable medium; and
    program instructions stored on the non-transitory computer-readable medium that are executable by the at least one processor to cause the computing system to:
        access a plurality of two-dimensional drawings representative of a construction project;
        for each respective two-dimensional drawing of the plurality of two-dimensional drawings, determine a plurality of candidate pixel regions;
        identify, from among the plurality of candidate pixel regions, a set of landmark pixel regions that appear in the plurality of two-dimensional drawings at a threshold rate, wherein a first two-dimensional drawing of the plurality of two-dimensional drawings includes a first subset of landmark pixel regions from among the set of landmark pixel regions, and wherein a second two-dimensional drawing of the plurality of two-dimensional drawings includes a second subset of landmark pixel regions from among the set of landmark pixel regions;
        compare the first subset of landmark pixel regions with the second subset of landmark pixel regions to thereby identify a subset of shared landmark pixel regions that appear in both the first two-dimensional drawing and the second two-dimensional drawing;
        project the first two-dimensional drawing and the second two-dimensional drawing onto a projection space such that one or more of the shared landmark pixel regions from the first two-dimensional drawing align with one or more of the shared landmark pixel regions from the second two-dimensional drawing; and
        determine an extent of similarity between the projected first and second two-dimensional drawings in the projection space to thereby determine whether the first two-dimensional drawing and the second two-dimensional drawing depict a same portion of the construction project.

2. The computing system of claim 1, wherein the computing system further comprises program instructions that are executable by the at least one processor to cause the computing system to:
    for each respective two-dimensional drawing of the plurality of two-dimensional drawings, determine respective sets of characteristics of the plurality of candidate pixel regions;
    wherein the program instructions executable to cause the computing system to identify the set of landmark pixel regions that appear in the plurality of two-dimensional drawings at the threshold rate comprise program instructions that are executable by the at least one processor to cause the computing system to:
    compare the respective sets of characteristics of the plurality of candidate pixel regions;
    based on the comparison of the respective sets of characteristics of the plurality of candidate pixel regions, determine that a particular candidate pixel region has a threshold similarity with other candidate pixel regions in at least a threshold number of the two-dimensional drawings; and
    based on the particular candidate pixel region having the threshold similarity with the other candidate pixel regions in at least the threshold number of the two-dimensional drawings, include the particular candidate pixel region in the set of landmark pixel regions.

3. The computing system of claim 2, wherein the program instructions executable to cause the computing system to determine the respective sets of characteristics of the plurality of candidate pixel regions comprise program instructions that are executable by the at least one processor to cause the computing system to determine respective vectors corresponding to the characteristics of the plurality of candidate pixel regions; and
    wherein the program instructions executable to cause the computing system to compare the respective sets of characteristics of the plurality of candidate pixel regions comprise program instructions that are executable by the at least one processor to cause the computing system to determine cosine similarities between the respective vectors corresponding to the characteristics of the plurality of candidate pixel regions.

4. The computing system of claim 2, wherein the program instructions executable to cause the computing system to compare the first subset of landmark pixel regions with the second subset of landmark pixel regions to thereby identify a subset of shared landmark pixel regions that appear in both the first two-dimensional drawing and the second two-dimensional drawing comprise program instructions that are executable by the at least one processor to cause the computing system to:
  compare the respective sets of characteristics of the first subset of landmark pixel regions with the respective sets of characteristics of the second subset of landmark pixel regions;
  based on the comparison of the respective sets of characteristics of the first subset of landmark pixel regions with the respective sets of characteristics of the second subset of landmark pixel regions, determine that a first landmark pixel region of the first subset of landmark pixel regions has a threshold similarity with a second landmark pixel region of the second subset of landmark pixel regions; and
  based on the first landmark pixel region having the threshold similarity with the second landmark pixel region, include the first landmark pixel region and the second landmark pixel region in the subset of shared landmark pixel regions.

5. The computing system of claim 1, wherein the program instructions executable to cause the computing system to determine the plurality of candidate pixel regions comprise program instructions that are executable by the at least one processor to cause the computing system to:
  randomly or pseudorandomly select a plurality of pixels of the respective two-dimensional drawing; and
  determine the plurality of candidate pixel regions to be a plurality of pixel regions encompassing the randomly or pseudorandomly selected plurality of pixels.

6. The computing system of claim 1, wherein the program instructions executable to cause the computing system to determine the extent of similarity between the projected first and second two-dimensional drawings in the projection space comprise program instructions that are executable by the at least one processor to cause the computing system to:
  perform a pixel-by-pixel comparison between the projected first and second two-dimensional drawings.

7. The computing system of claim 6, wherein the computing system further comprises program instructions that are executable by the at least one processor to cause the computing system to:
  based on the pixel-by-pixel comparison between the projected first and second two-dimensional drawings, generate an output indicating which pixels are different between the projected first and second two-dimensional drawings.

8. The computing system of claim 6, wherein the program instructions executable to cause the computing system to determine whether the first two-dimensional drawing and the second two-dimensional drawing depict the same portion of the construction project comprise program instructions that are executable by the at least one processor to cause the computing system to:
  based on the pixel-by-pixel comparison between the projected first and second two-dimensional drawings, determine how many pixels match between the projected first and second two-dimensional drawings;
  if a number of matched pixels is above a threshold number, then determine that the first two-dimensional drawing and the second two-dimensional drawing depict the same portion of the construction project; and
  if the number of matched pixels is below the threshold number, then determine that the first two-dimensional drawing and the second two-dimensional drawing do not depict the same portion of the construction project.

9. The computing system of claim 1, wherein the program instructions executable to cause the computing system to project the first two-dimensional drawing and the second two-dimensional drawing onto the projection space comprise program instructions that are executable by the at least one processor to cause the computing system to:
  apply one or more of a translation, reflection, rotation, or dilation to one or both of the first two-dimensional drawing or the second two-dimensional drawing.

10. A method comprising:
  accessing a plurality of two-dimensional drawings representative of a construction project;
  for each respective two-dimensional drawing of the plurality of two-dimensional drawings, determining a plurality of candidate pixel regions;
  identifying, from among the plurality of candidate pixel regions, a set of landmark pixel regions that appear in the plurality of two-dimensional drawings at a threshold rate, wherein a first two-dimensional drawing of the plurality of two-dimensional drawings includes a first subset of landmark pixel regions from among the set of landmark pixel regions, and wherein a second two-dimensional drawing of the plurality of two-dimensional drawings includes a second subset of landmark pixel regions from among the set of landmark pixel regions;
  comparing the first subset of landmark pixel regions with the second subset of landmark pixel regions to thereby identify a subset of shared landmark pixel regions that appear in both the first two-dimensional drawing and the second two-dimensional drawing;
  projecting the first two-dimensional drawing and the second two-dimensional drawing onto a projection space such that one or more of the shared landmark pixel regions from the first two-dimensional drawing align with one or more of the shared landmark pixel regions from the second two-dimensional drawing; and
  determining an extent of similarity between the projected first and second two-dimensional drawings in the projection space to thereby determine whether the first two-dimensional drawing and the second two-dimensional drawing depict a same portion of the construction project.

11. The method of claim 10, further comprising:
  for each respective two-dimensional drawing of the plurality of two-dimensional drawings, determining respective sets of characteristics of the plurality of candidate pixel regions;
  wherein identifying the set of landmark pixel regions that appear in the plurality of two-dimensional drawings at the threshold rate comprises:
  comparing the respective sets of characteristics of the plurality of candidate pixel regions;
  based on the comparison of the respective sets of characteristics of the plurality of candidate pixel regions, determining that a particular candidate pixel region has a threshold similarity with other candidate pixel regions in at least a threshold number of the two-dimensional drawings; and
  based on the particular candidate pixel region having the threshold similarity with the other candidate pixel regions in at least the threshold number of the two-dimensional drawings, including the particular candidate pixel region in the set of landmark pixel regions.

12. The method of claim 11, wherein comparing the first subset of landmark pixel regions with the second subset of landmark pixel regions to thereby identify the subset of shared landmark pixel regions that appear in both the first two-dimensional drawing and the second two-dimensional drawing comprises:
   comparing the respective sets of characteristics of the first subset of landmark pixel regions with the respective sets of characteristics of the second subset of landmark pixel regions;
   based on the comparison of the respective sets of characteristics of the first subset of landmark pixel regions with the respective sets of characteristics of the second subset of landmark pixel regions, determining that a first landmark pixel region of the first subset of landmark pixel regions has a threshold similarity with a second landmark pixel region of the second subset of landmark pixel regions; and
   based on the first landmark pixel region having the threshold similarity with the second landmark pixel region, including the first landmark pixel region and the second landmark pixel region in the subset of shared landmark pixel regions.

13. The method of claim 10, wherein determining the plurality of candidate pixel regions comprises:
   randomly or pseudorandomly selecting a plurality of pixels of the respective two-dimensional drawing; and
   determining the plurality of candidate pixel regions to be a plurality of pixel regions encompassing the randomly or pseudorandomly selected plurality of pixels.

14. The method of claim 10, wherein determining the extent of similarity between the projected first and second two-dimensional drawings in the projection space comprises:
   performing a pixel-by-pixel comparison between the projected first and second two-dimensional drawings.

15. The method of claim 14, further comprising:
   based on the pixel-by-pixel comparison between the projected first and second two-dimensional drawings, generating an output indicating which pixels are different between the projected first and second two-dimensional drawings.

16. A non-transitory computer-readable storage medium having program instructions stored thereon that are executable to cause a computing system to:
   access a plurality of two-dimensional drawings representative of a construction project;
   for each respective two-dimensional drawing of the plurality of two-dimensional drawings, determine a plurality of candidate pixel regions;
   identify, from among the plurality of candidate pixel regions, a set of landmark pixel regions that appear in the plurality of two-dimensional drawings at a threshold rate, wherein a first two-dimensional drawing of the plurality of two-dimensional drawings includes a first subset of landmark pixel regions from among the set of landmark pixel regions, and wherein a second two-dimensional drawing of the plurality of two-dimensional drawings includes a second subset of landmark pixel regions from among the set of landmark pixel regions;
   compare the first subset of landmark pixel regions with the second subset of landmark pixel regions to thereby identify a subset of shared landmark pixel regions that appear in both the first two-dimensional drawing and the second two-dimensional drawing;
   project the first two-dimensional drawing and the second two-dimensional drawing onto a projection space such that one or more of the shared landmark pixel regions from the first two-dimensional drawing align with one or more of the shared landmark pixel regions from the second two-dimensional drawing; and
   determine an extent of similarity between the projected first and second two-dimensional drawings in the projection space to thereby determine whether the first two-dimensional drawing and the second two-dimensional drawing depict a same portion of the construction project.

17. The non-transitory computer-readable storage medium of claim 16, wherein the program instructions are further executable to cause the computing system to:
   for each respective two-dimensional drawing of the plurality of two-dimensional drawings, determine respective sets of characteristics of the plurality of candidate pixel regions;
   wherein the program instructions executable to cause the computing system to identify the set of landmark pixel regions that appear in the plurality of two-dimensional drawings at the threshold rate comprise program instructions that are executable to cause the computing system to:
   compare the respective sets of characteristics of the plurality of candidate pixel regions;
   based on the comparison of the respective sets of characteristics of the plurality of candidate pixel regions, determine that a particular candidate pixel region has a threshold similarity with other candidate pixel regions in at least a threshold number of the two-dimensional drawings; and
   based on the particular candidate pixel region having the threshold similarity with the other candidate pixel regions in at least the threshold number of the two-dimensional drawings, include the particular candidate pixel region in the set of landmark pixel regions.

18. The non-transitory computer-readable storage medium of claim 17, wherein the program instructions executable to cause the computing system to compare the first subset of landmark pixel regions with the second subset of landmark pixel regions to thereby identify a subset of shared landmark pixel regions that appear in both the first two-dimensional drawing and the second two-dimensional drawing comprise program instructions that are executable to cause the computing system to:
   compare the respective sets of characteristics of the first subset of landmark pixel regions with the respective sets of characteristics of the second subset of landmark pixel regions;
   based on the comparison of the respective sets of characteristics of the first subset of landmark pixel regions with the respective sets of characteristics of the second subset of landmark pixel regions, determine that a first landmark pixel region of the first subset of landmark pixel regions has a threshold similarity with a second landmark pixel region of the second subset of landmark pixel regions; and
   based on the first landmark pixel region having the threshold similarity with the second landmark pixel region, include the first landmark pixel region and the second landmark pixel region in the subset of shared landmark pixel regions.

19. The non-transitory computer-readable storage medium of claim 16, wherein the program instructions executable to cause the computing system to determine the plurality of candidate pixel regions comprise program instructions executable to cause the computing system to:
   randomly or pseudorandomly select a plurality of pixels of the respective two-dimensional drawing; and determine the plurality of candidate pixel regions to be a plurality of pixel regions encompassing the randomly or pseudorandomly selected plurality of pixels.

20. The non-transitory computer-readable storage medium of claim 16, wherein the program instructions executable to cause the computing system to determine the extent of similarity between the projected first and second two-dimensional drawings in the projection space comprise program instructions executable to cause the computing system to:

perform a pixel-by-pixel comparison between the projected first and second two-dimensional drawings; and based on the pixel-by-pixel comparison between the projected first and second two-dimensional drawings, generate an output indicating which pixels are different between the projected first and second two-dimensional drawings.

\* \* \* \* \*